(12) United States Patent
Chan (10) Patent No.: US 6,600,358 B1
(45) Date of Patent: Jul. 29, 2003

(54) ELIMINATION OF CURRENT DRAIN IN STEP-UP LEVEL SHIFTER WHEN LOW POWER DOMAIN IS OFF

(75) Inventor: Wai Cheong Chan, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/210,940

(22) Filed: Aug. 2, 2002

(51) Int. Cl.[7] .......................................... H03K 19/0185
(52) U.S. Cl. ......................................... 327/333; 326/81
(58) Field of Search ............................ 327/333, 80, 81, 327/143; 326/80, 81

(56) References Cited

U.S. PATENT DOCUMENTS

| | | | |
|---|---|---|---|
| 5,912,577 A | * | 6/1999 | Takagi .......................... 327/333 |
| 6,005,432 A | * | 12/1999 | Guo et al. ..................... 327/333 |
| 6,064,229 A | * | 5/2000 | Morris ........................... 326/81 |
| 6,147,540 A | * | 11/2000 | Coddington ................. 327/333 |
| 6,188,243 B1 | * | 2/2001 | Liu et al. ....................... 326/81 |
| 6,344,758 B1 | | 2/2002 | Turner et al. |
| 6,384,631 B1 | | 5/2002 | Wert et al. |
| 6,385,099 B1 | | 5/2002 | Taub |
| 2001/0011917 A1 | | 8/2001 | Kim et al. |

* cited by examiner

Primary Examiner—Toan Tran
(74) Attorney, Agent, or Firm—Vollrath & Assoc.

(57) ABSTRACT

In a level shifter for shifting from one voltage to another one, a circuit to eliminate current drain when the low voltage supply is off, includes circuitry for eliminating floating nodes and for providing a distinct output voltage. The circuit includes circuitry for monitoring the low voltage supply and switch in the level shifter when the supply is on. When the supply is off, the input is isolated from the output and an output signal derived from the high voltage supply is provided to the output.

22 Claims, 11 Drawing Sheets

ELIMINATION OF CURRENT DRAIN IN STEP-UP LEVEL SHIFTER WHEN LOW POWER DOMAIN IS OFF

FIELD OF THE INVENTION

The invention relates to level shifters for shifting from one voltage level or power domain to another. In particular, it relates to a way of avoiding current drain in the higher power domain when the lower power domain is off.

BACKGROUND OF THE INVENTION

Semiconductor devices such as VLSI chips, it is common to have more than one voltage level or power domain. In order to be able to correctly handle signals passing from one power domain to another, level shifter circuits are included to convert the voltage level of the signal so as to correctly work with the devices in the new power domain. For instance, where a transition is made from a power domain operating at a low voltage level (VDDL) of 1.2 V to a higher power domain operating at a higher voltage (VDDH) of 3.3 V, a high input signal of 1.2 V would not necessarily be interpreted in the high power domain as a high logic level. It is therefore necessary to adjust the voltage level of the input signal to be correctly interpreted in the new power domain. This is achieved through the use of a level shifter such as the step up level shifter 100 shown in FIG. 1.

Figure 1:
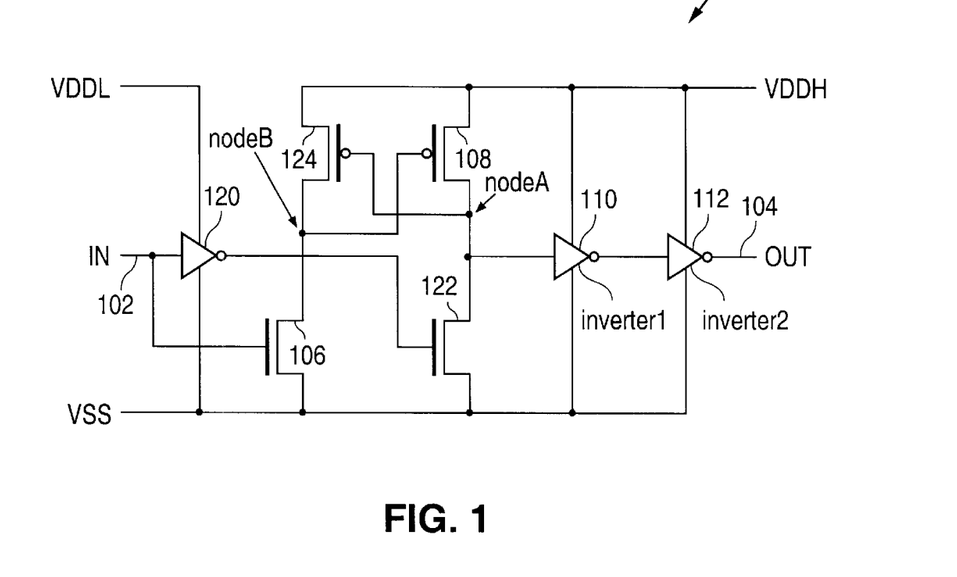
FIG. 1 is a schematic circuit diagram of a prior art step-up level shifter.

The level shifter 100 has an input 102 working at a low power level (VDDL) and an output 104 which supplies an output signal as dictated by the higher voltage (VDDH) of the higher power domain. A logic high signal will switch on transistor 106, thereby pulling node B to ground and switching transistor 108 on. This pulls node A high to the voltage level VDDH. The logic high passes through the two inverters 110, 112 to provide a high output signal in accordance with the high power domain requirements.

During a logic low on the input 102, the inverter 120 provides a high signal to the transistor 122 to switch transistor 122 on and pull node A to VSS. This switches on PMOS transistor 124 to pull node B high. This switches off transistor 108 to ensure that node A is low, thereby providing a low output signal at output 104 (as determined by the two inverters 110, 112).

Figure 2:
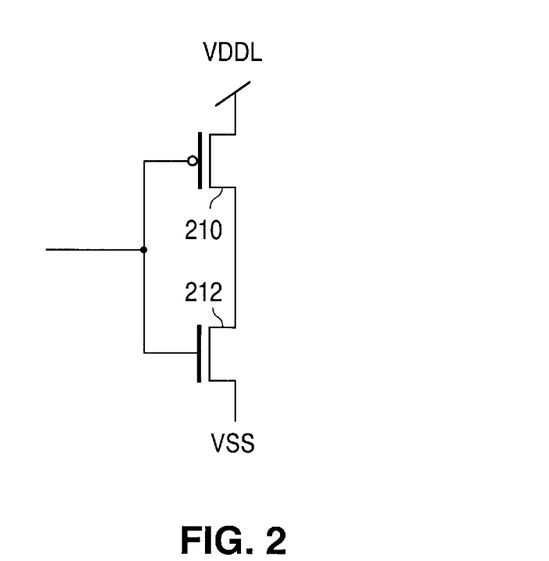
FIG. 2 is a schematic circuit diagram of a typical inverter.

However, for power management purposes it is common to turn off parts of a chip. When VDDL is shut off, there will, thus be floating nodes in the level shifter 100. In particular, when VDDL is turned off, the signal on input 102 becomes indeterminable. Since NMOS transistors 106, 122 are not being actively driven, nodes A and B float. In the worst case, the nodes A and B could float to half VDDH, thereby causing a static current drain through inverters 110, 112. This could adversely affect other gates connected to the output 104. This can be best understood by considering a simple inverter circuit as shown in FIG. 2. If VDDH is at 3.3 V, the input to the inverter 200 is at about 1.6 when the floating nodes float to half VDDH. This means that both the PMOS transistor 210 and the NMOS transistor 212 are turned on since the voltage is not high enough to turn off the PMOS transistor 210, or low enough to turn off NMOS transistor 212. Thus, there is a static current drain.

The present invention seeks to eliminate this problem.

SUMMARY OF THE INVENTION

The invention provides a circuit to eliminate potential static current drain in a step-up level shifter when the power to the lower potential power domain in a multi-power system is switched off.

Thus, according to the invention, there is provided a method to eliminate static current drain in a level shifter when the power to a low potential power domain VDDL in a multi-power system is switched off, wherein the shifter shifts signal voltages from a low potential power domain VDDL to a high potential power domain VDDH, comprising providing a signal path from the input to the output of the level shifter under power conditions when VDDL is active, and isolating the input from the output when VDDL is off, and providing, from VDDH, a low or high level signal at the output. The provision of the signal from VDDH typically includes a signal generating circuit powered by VDDH. Preferably the method includes isolating the signal generating circuit under power conditions. The method typically includes monitoring VDDL to determine whether VDDL is active.

Further, according to the invention, there is provided a circuit for eliminating static current drain in a level shifter when the power to a low potential power domain VDDL in a multi-power system is switched off, wherein the shifter shifts signal voltages from a low potential power domain VDDL to a high potential power domain VDDH, comprising VDDL monitoring circuitry, isolation circuitry for isolating the input to the level shifter when VDDL is switched off, and signal generating circuitry for generating a signal for the output of the level shifter when VDDL is off. Typically the circuit provides a signal path through the level shifter when VDDL is on. The signal generating circuitry is preferably powered by VDDH and the signal generated is either a high or a low signal for the high potential power domain. The high or low signal is determined according to the nature of the circuitry that receives the signal. The isolation circuitry may be controlled by the monitoring circuitry to isolate the input when the monitoring circuitry detects VDDL is switched off. The isolation circuitry may include a pass gate. The monitoring circuitry may be configured to deactivate the isolation circuitry when VDDL is on. The monitoring circuitry is preferably powered by VDDH. The monitoring circuitry may include voltage step down circuitry to lower the voltage supplied to it. The voltage step down circuitry may include a plurality of strings of one or more transistors connected to VDDH, and at least some of the strings supplying inverters. At least some of the strings may define different voltage step downs. The voltage step down caused by each string of transistors is preferably chosen to ensure that when the input supplied to the associated inverter is high, it is sufficiently high to switch off the PMOS transistor of the inverter. Typically the input to the first inverter is from VDDL. Typically the transistor strings associated with the other inverters are shorter than the first transistor string, to provide for increasing output voltages from successive inverters.

DETAILED DESCRIPTION OF THE INVENTION

Figure 3:
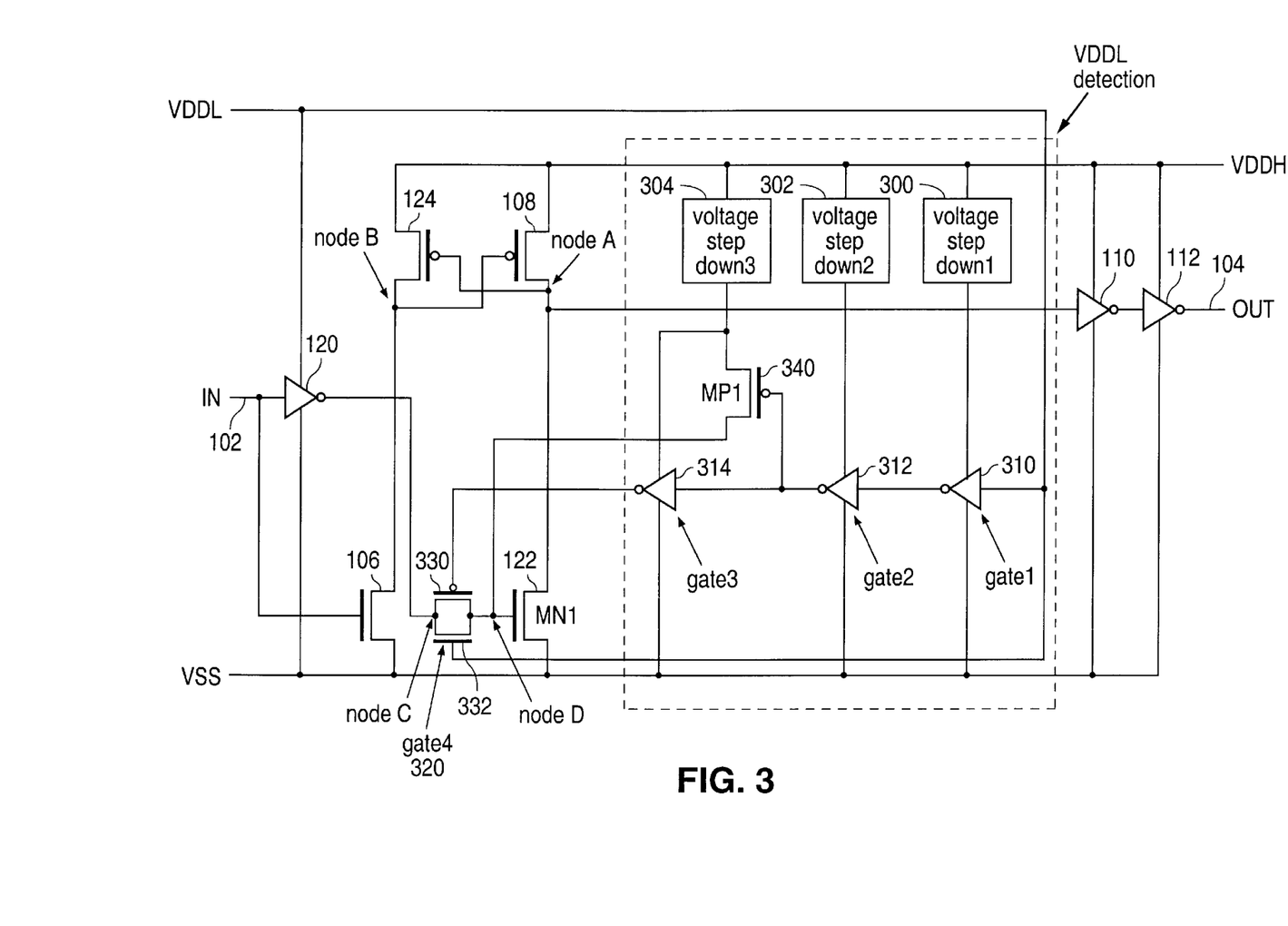
FIG. 3 is a schematic circuit diagram of a level shifter with a partial block diagram of one embodiment of a circuit of the invention.
Figure 6:
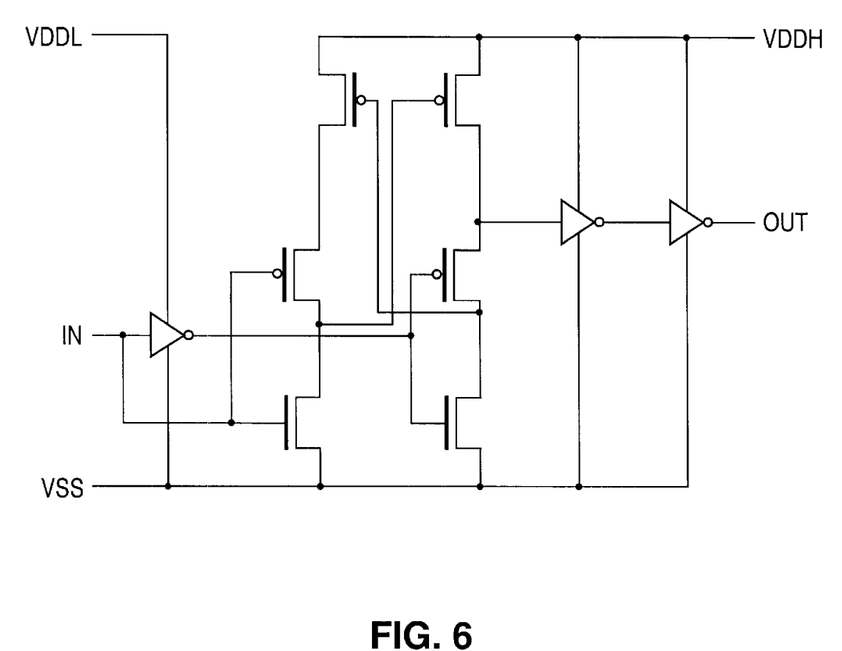
FIG. 6 is a schematic circuit diagram of another prior art step-up level shifter.

FIG. 3 shows a level shifter with circuitry of one embodiment of the invention. The level shifter is essentially the same as the one depicted in FIG. 1, and for simplicity, the same reference numerals are used for the same elements. The circuit of the invention is designated by broken lines forming a box around the circuit. It will be appreciated that the level shifter could, be configured differently. For example, the level shifter of FIG. 6 could be used instead of the level shifter of FIG. 1.

This embodiment of the invention includes a VDDL monitoring or detecting circuit comprising three voltage step downs 300, 302, 304. These serve to step down the voltage for the inverters 310, 312, 314 to ensure that when the inputs to the inverters go high, the PMOS transistors of the inverters (see for example, the inverter shown in FIG. 2) turn off. If the inverters 310, 312, 314 were supplied directly by VDDH, the sources of the PMOS transistors would be at 3.3 V and the gates would be at 1.2 V for VDDL high. Thus the PMOS would see an input that is low relative to its drain, and would switch on. The voltage step downs are shown in more detail in FIG. 4 which shows different length strings of transistors. The first string includes five transistors 400, 402, 404, 406, 408. The second string includes three transistors 410, 412, 414. The third string includes two transistors 420, 422. Thus the first string of transistors provides the largest voltage drop. The voltage drop of each string is chosen to provide a small increase in signal voltage for the next string, thereby allowing the next string to be shorter.

Figure 4:
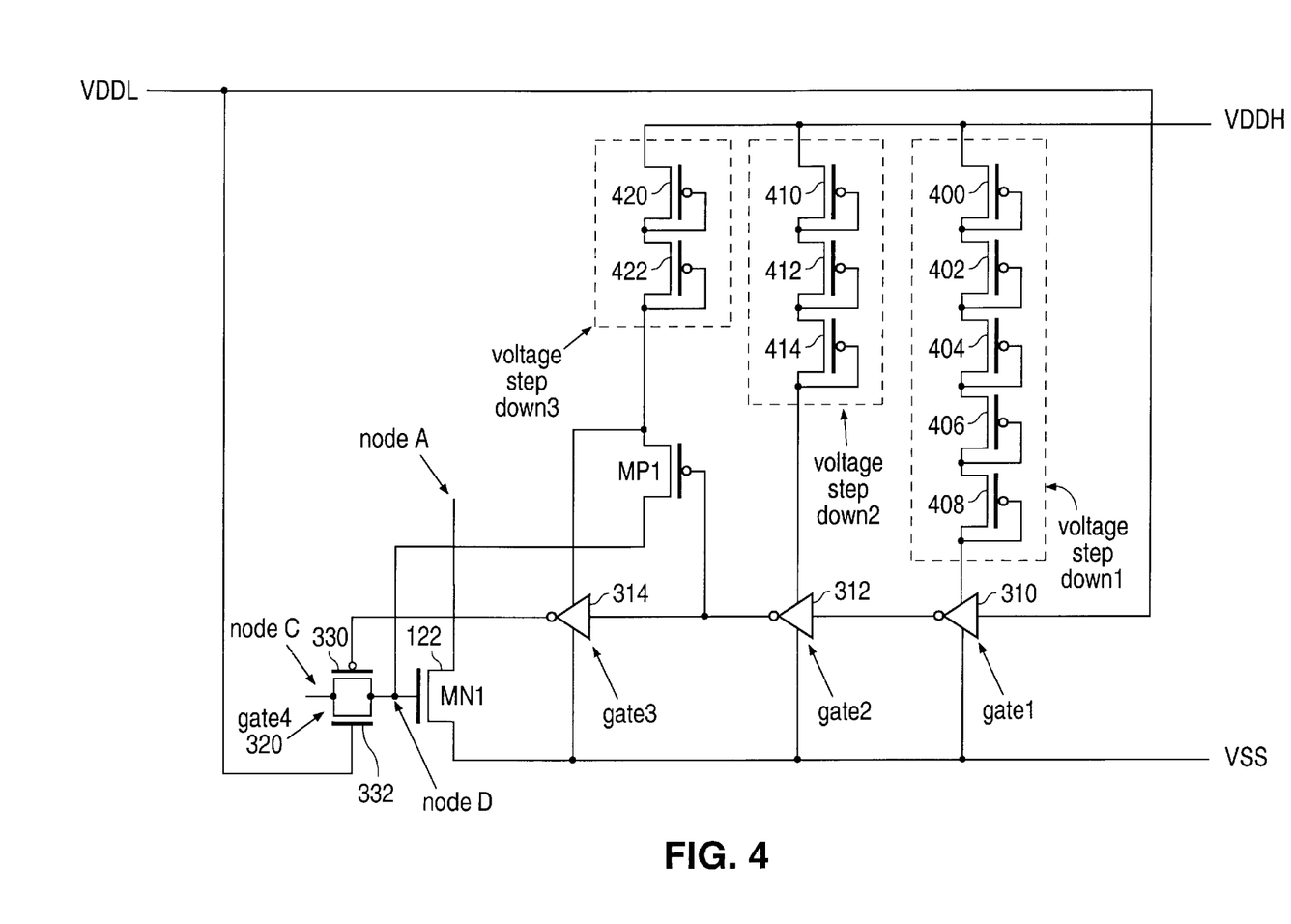
FIG. 4 is a more detailed schematic circuit diagram of the embodiment of the invention of FIG. 3.

Under normal operation when VDDL is on, the circuit of the invention provides a signal path for the input signal at the input 104, through the level shifter. This is done by switching on the pass gate 320. Since VDDL is high, the inverter 314 provides a low output. This switches on the PMOS transistor 330 of the pass gate 320. Also, VDDL is connected to the gate of NMOS transistor 332 of the pass gate 320 thereby switching on NMOS 332. Thus, the input signal on input 102 is provided to the gates of transistors 106 and 122, and is level shifted by the level shifter, in the same way as was discussed above with respect to FIG. 1.

When VDDL is switched off, the input to inverter 310 goes low. As discussed above, the transistor string of voltage step down 300 ensures that the PMOS transistor (not shown) operates correctly. Now, when VDDL is low, the inverter 310 switches on to provide a slightly elevated voltage output signal. The output signal from inverter 314 is even higher due to the shorter transistor string of its voltage step down 304. This high signal switches off transistor 330. The low VDDL signal, in turn switches off transistor 332, thereby, effectively switching off the pass gate 320 and isolating the input 102. This avoids the indeterminate signal at the input 102 (since VDDL is off) from being passed through to the level shifter.

Instead, the circuit of the invention generates its own signal for the output. In the present embodiment, the circuit generates a low signal. However, it will be appreciated that the appropriate signal at the output depends on the circuit connected to the output 104. If a high output is needed (i.e., if the circuit attached to the output requires a high signal) a circuit such as the one in FIG. 5 can be used.

In order to achieve the low output, the gate of transistor 340 is connected to the output from inverter 312. The low signal from inverter 312 switches on transistor 340, which switches on transistor 122 and pulls node A to VSS. This is presented as a low signal at the output 104 via the two inverters 110, 112. Thus, when VDDL is off, the circuit of the invention provides a well defined low output signal. Also, by pulling node A to VSS, it switches transistor 124 on,.which switches off transistor 108. Thus node A will be at VSS and node B at VDDH, thereby avoiding any floating nodes that could cause inverters 110 and 112 to conduct static current.

As mentioned above, FIG. 5 shows one embodiment of the invention which provides a high output while also eliminating the floating nodes. Node D represents the inverted input signal that is fed to transistor 122 (for convenience and ease of understanding, the same reference numerals are used for similar components as in the previous embodiment). As before, the output (not shown) is connected to the node A via two inverters (not shown). Also, the input is connected to the gate of a NMOS transistor (not shown) similar to the transistor 106 in FIG. 3. Thus node D is connected much like node C in the embodiment of FIGS. 3 and 4. When VDDL is active (on), transistors 500 and 340 are off, thus having no effect on the normal operation of the level shifter (not shown). When VDDL is shut down (off), the output of inverter turns on transistor 500. This pulls node D to VSS and switches off transistor 122. The output from inverter 312, in turn, goes low and switches on transistor 340, thereby ensuring that node A is high to provide a high output via the two inverters (not shown). Referring to FIG. 3 (which shows the level shifter), it will be appreciated that a high on node A will switch off transistor 124 of the level shifter. Thus no current drainage is caused by floating nodes at the inputs of inverters 110, 112.

For a better understanding of the voltage levels under various operating conditions for the embodiments of FIGS. 4 and 5, FIGS. 7–12 have been included.

Figure 7:
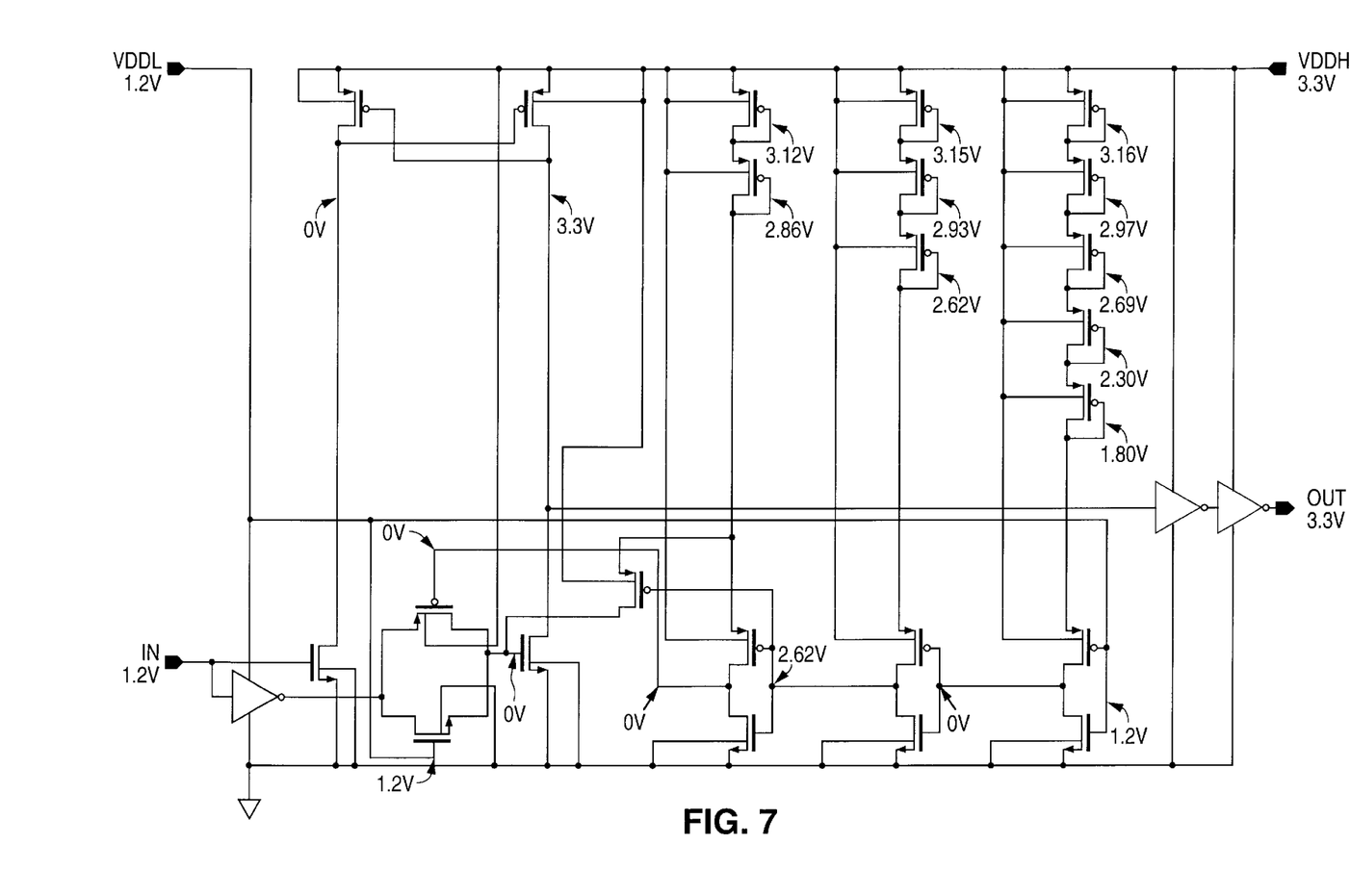
FIGS. 7–9 show the embodiment of FIG. 4 under various operating conditions.
Figure 8:
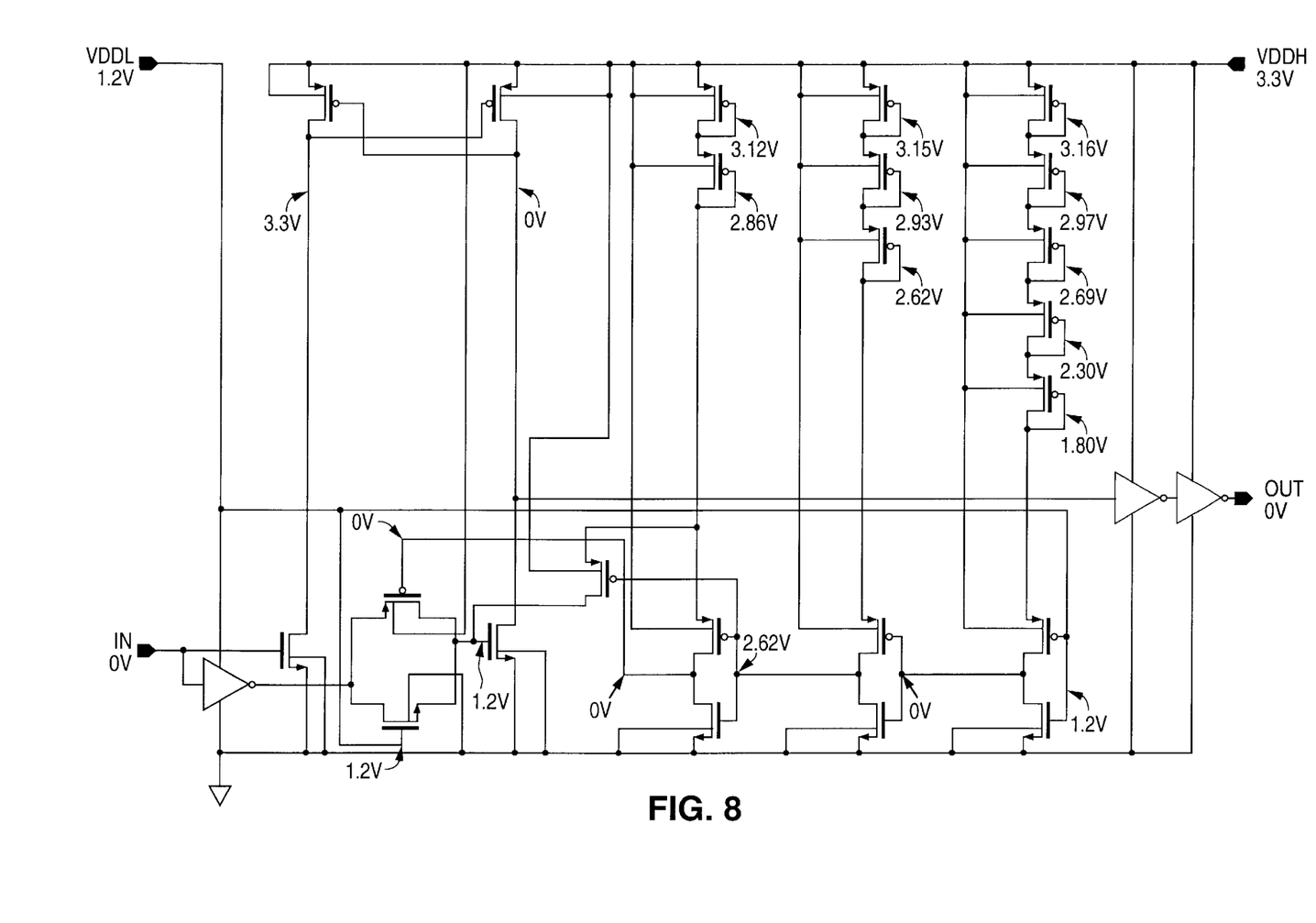
Figure 9:
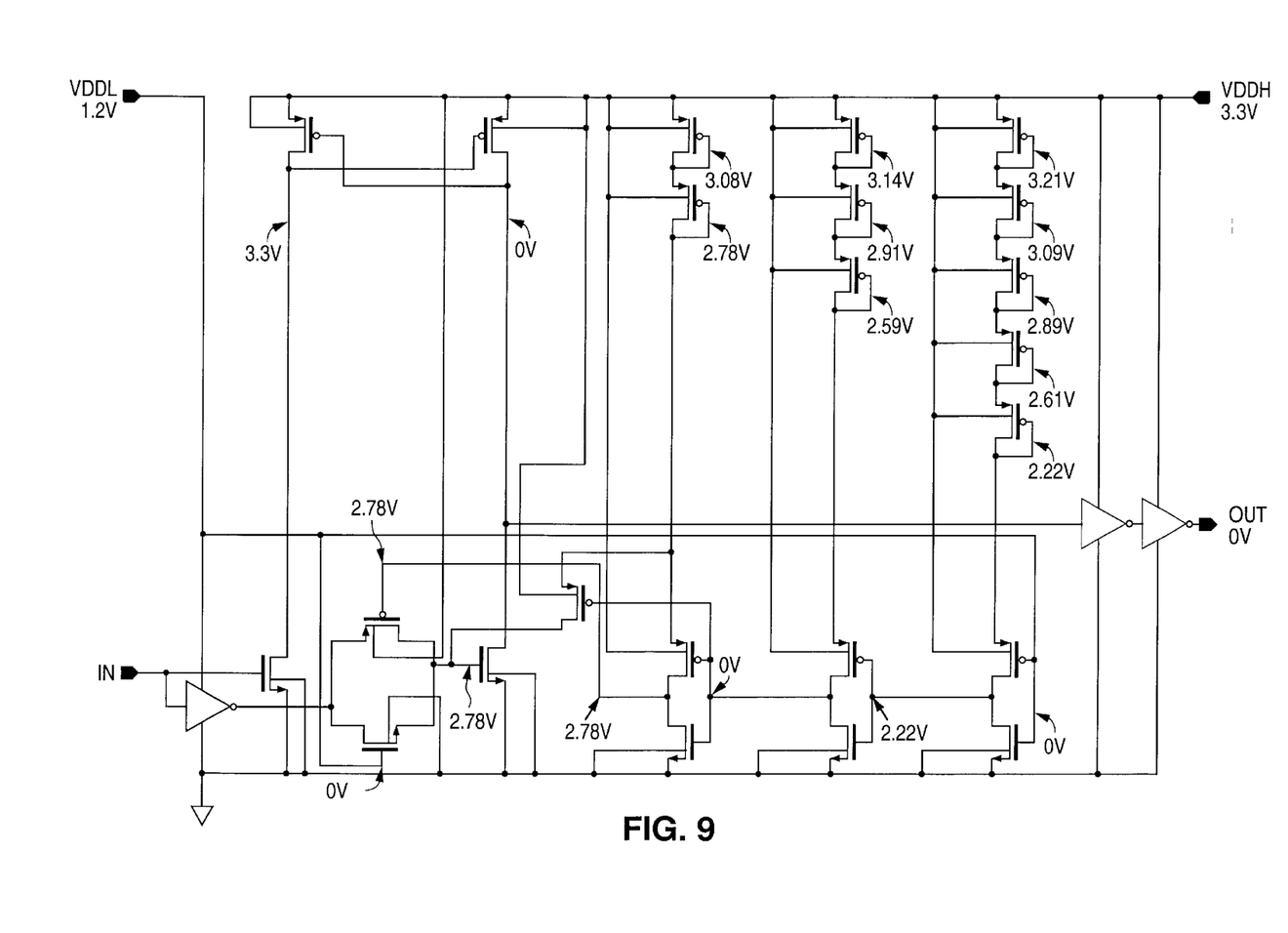

FIGS. 7 and 8 show the embodiment of FIG. 4 when VDDL is on, for high and low, respectively, on the input. FIG. 9 shows the embodiment of FIG. 4 when VDDL is off.

Figure 5:
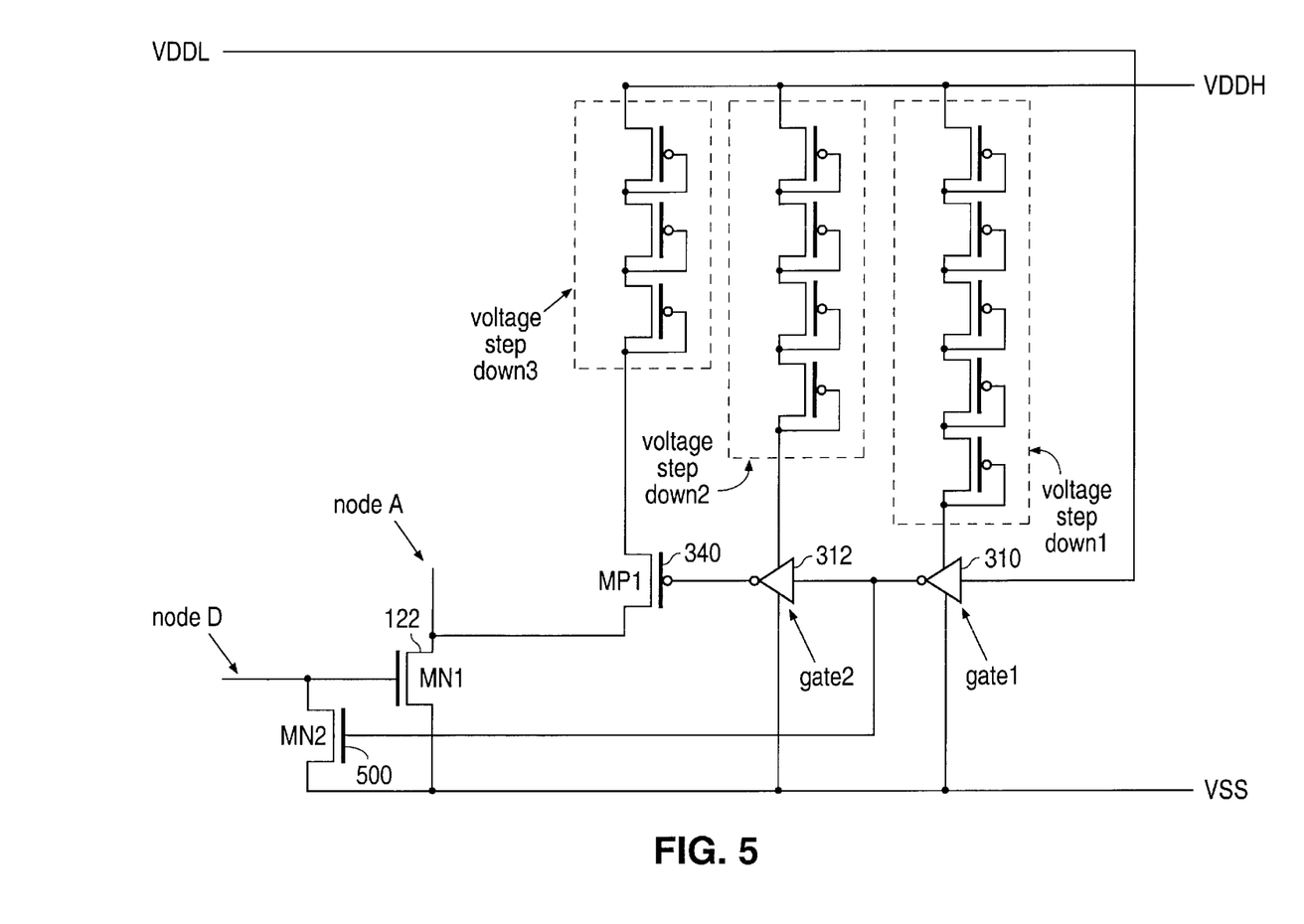
FIG. 5 is a schematic circuit diagram of another embodiment of the invention.
Figure 10:
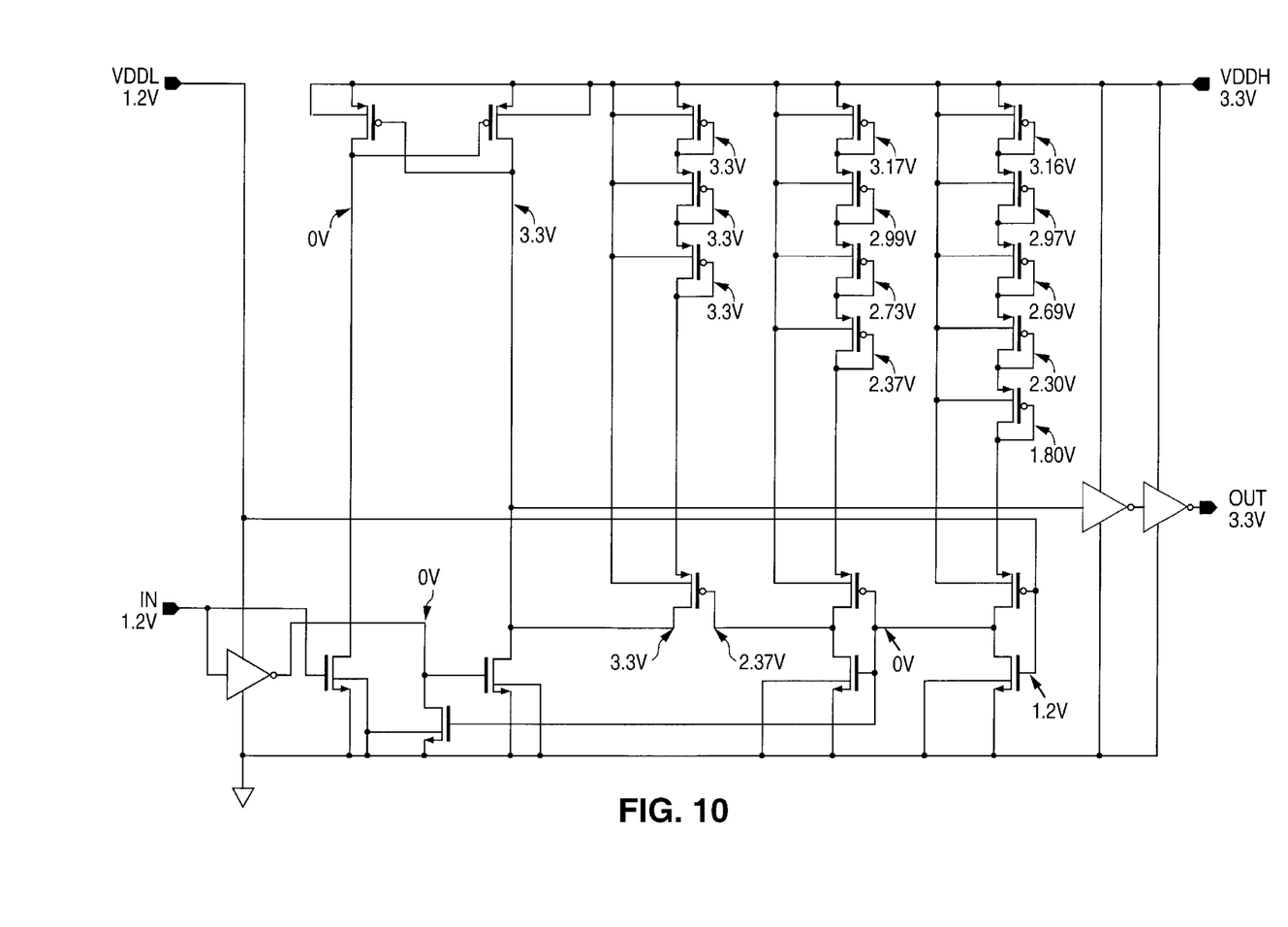
FIGS. 10–12 show the embodiment of FIG. 5 under various operating conditions.
Figure 11:
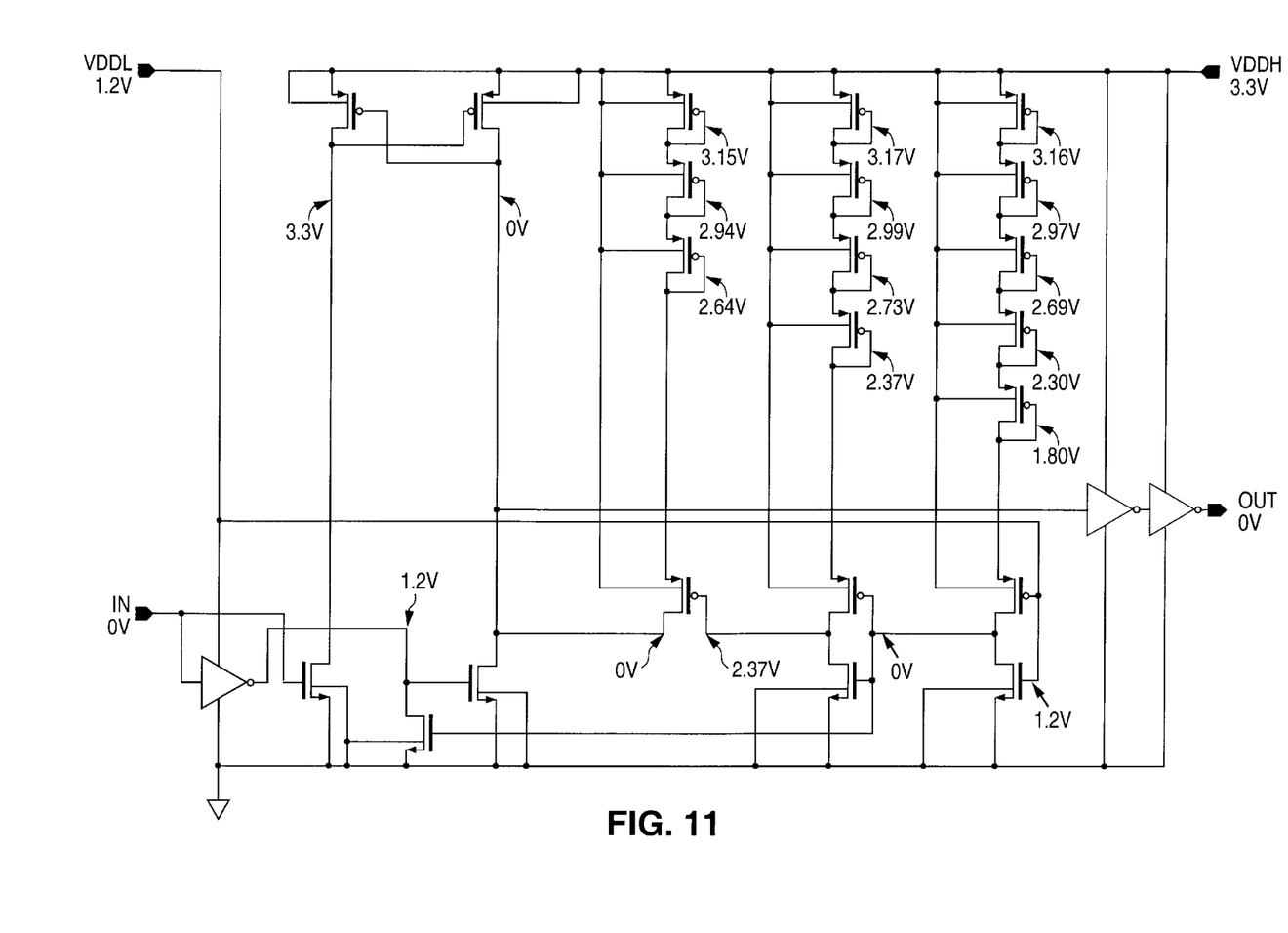
Figure 12:
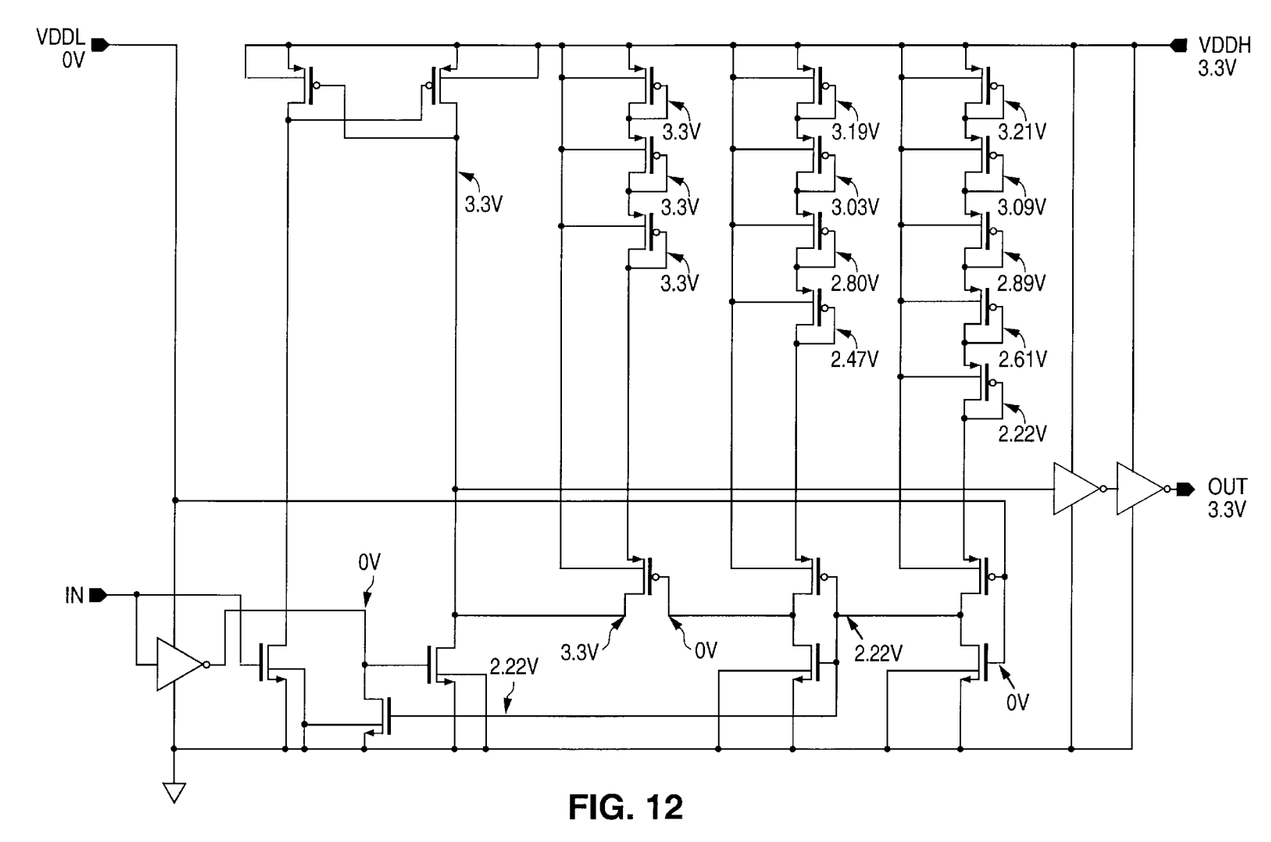

FIGS. 10 and 11 show the embodiment of FIG. 5 when VDDL is on, for high and low, respectively, on the input. FIG. 12 shows the embodiment of FIG. 5 when VDDL is off.

While the invention has been described with respect to specific embodiments it will be appreciated that the invention can be implemented in different ways without departing from the scope of the invention.

What is claimed is:

1. A method to eliminate static current drain in a step-up level shifter when the power to the low potential power domain (VDDL) in a multi-power system is switched off, wherein the shifter shifts signal voltages from a low potential power domain (VDDL) to a high potential power domain (VDDH), comprising
   providing a signal path from the input to the output of the level shifter under active power conditions when VDDL is active,
   isolating the input from the output when VDDL is off, and
   providing, from VDDH, a low or high level signal to the output.

2. A method of claim 1, wherein the provision of the signal from VDDH includes providing a signal generating circuit powered by VDDH.

3. A method of claim 2, further including isolating the signal generating circuit under active power conditions.

4. A method of claim 1, further including monitoring VDDL to determine whether VDDL is active.

5. A method of claim 3, further including monitoring VDDL to determine whether VDDL is active.

6. A circuit for eliminating static current drain in a step-up level shifter when the low potential power domain (VDDL) in a multi-power system is switched off, wherein the shifter shifts signal voltages from a low potential power domain (VDDL) to a high potential power domain (VDDH), comprising VDDL-monitoring circuitry, isolation circuitry for isolating the input to the level shifter when VDDL is off, and signal generating circuitry for generating a definite high or low signal for the output of the level shifter when VDDL is off.

7. A circuit of claim 6, further comprising switches for interrupting all current paths to ground.

8. A circuit of claim 6, wherein the circuit provides a signal path to the level shifter when VDDL is on.

9. A circuit of claim 6, wherein the signal generating circuitry is preferably powered by VDDH and the signal generated is either a high or a low signal for the high potential power domain.

10. A circuit of claim 6, wherein the signal generating circuitry generates a high or low signal.

11. A circuit of claim 10, wherein the high or low signal is determined according to the nature of the circuitry attached to the output.

12. A circuit of claim 6, wherein the isolation circuitry is controlled by the monitoring circuitry to isolate the input when the monitoring circuitry detects that VDDL is switched off.

13. A circuit of claim 12, wherein the isolation circuitry includes a pass gate.

14. A circuit of claim 12, wherein the monitoring circuitry is configured to deactivate the isolation circuitry when VDDL is on.

15. A circuit of claim 14, wherein the monitoring circuitry is powered by VDDH.

16. A circuit of claim 15, wherein the monitoring circuitry includes voltage step down circuitry to lower the voltage supplied to it.

17. A circuit of claim 16, wherein the voltage step down circuitry includes a plurality of strings of one or more transistors connected to VDDH, wherein at least some of the strings supply inverters.

18. A circuit of claim 17, wherein at least some of the strings define different voltage step downs.

19. A circuit of claim 18, wherein the voltage step down caused by each string of transistors is chosen to ensure that when the input supplied to the associated inverter is high, it is sufficiently high to switch off the inverter's PMOS transistor.

20. A circuit of claim 19, wherein the input to the first inverter is from VDDL.

21. A circuit of claim 20, wherein the transistor strings associated with the other inverters are shorter than the first transistor string, to provide for increasing output voltages from successive inverters.

22. A circuit for eliminating static current drain in a level shifter when the low potential power domain (VDDL) in a multi-power system is switched off, wherein the shifter shifts signal voltages from a low potential power domain (VDDL) to a high potential power domain (VDDH), comprising VDDL-monitoring circuitry, and switches for interrupting current paths to ground when VDDL is off.

* * * * *